(12) United States Patent
Tasai et al.

(10) Patent No.: US 9,871,349 B2
(45) Date of Patent: Jan. 16, 2018

(54) LIGHT-EMITTING ELEMENT

(71) Applicant: SONY CORPORATION, Tokyo (JP)

(72) Inventors: Kunihiko Tasai, Miyagi (JP); Eiji Nakayama, Miyagi (JP); Yuusuke Nakayama, Miyagi (JP); Shigetaka Tomiya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/034,256

(22) PCT Filed: Nov. 10, 2014

(86) PCT No.: PCT/JP2014/005646
§ 371 (c)(1),
(2) Date: May 4, 2016

(87) PCT Pub. No.: WO2015/075896
PCT Pub. Date: May 28, 2015

(65) Prior Publication Data
US 2016/0268776 A1 Sep. 15, 2016

(30) Foreign Application Priority Data
Nov. 20, 2013 (JP) .................................. 2013-239827

(51) Int. Cl.
*H01S 5/343* (2006.01)
*H01S 5/02* (2006.01)
(Continued)

(52) U.S. Cl.
CPC ........ *H01S 5/34333* (2013.01); *H01S 5/0202* (2013.01); *H01S 5/1085* (2013.01); *H01S 5/22* (2013.01); *H01S 5/3202* (2013.01)

(58) Field of Classification Search
CPC ...... H01S 5/34333; H01S 5/22; H01S 5/0202; H01S 5/1085; H01S 5/3202
See application file for complete search history.

(56) References Cited

U.S. PATENT DOCUMENTS

| 2009/0200573 A1 | 8/2009 | Kawakami et al. |
| 2011/0064100 A1 | 3/2011 | Raring et al. |
| (Continued) | | |

FOREIGN PATENT DOCUMENTS

JP 2012-227361 A 11/2012

OTHER PUBLICATIONS

Yohei Enya et al., "531 nm Green Lasing of InGaN Based Laser Diodes on Semi-Polar{2021} Free-Standing GaN Substrates", The Japan Society of Applied Physics, Jul. 17, 2009, Applied Physics Express, 2009, pp. 3.

(Continued)

*Primary Examiner* — Xinning Niu
(74) *Attorney, Agent, or Firm* — Chip Law Group (57) ABSTRACT

There is provided a light-emitting element including a laminated structure including a first compound semiconductor layer having a first conductivity type, a second compound semiconductor layer having a second conductivity type different than the first conductivity type, and a third compound semiconductor layer formed between the first and second compound semiconductor layers and including an active layer. A second end surface of the second compound semiconductor layer and a third end surface of the third compound semiconductor layer are formed at respective second and third angles theta2 and theta3 relative to a virtual vertical direction of the laminated structure and satisfy the following relationship: "absolute value of $theta_3$ is equal to or greater than 0 degree and smaller than absolute value of $theta_2$".

20 Claims, 5 Drawing Sheets (51) Int. Cl.
*H01S 5/10* (2006.01)
*H01S 5/32* (2006.01)
*H01S 5/22* (2006.01)

(56) References Cited

U.S. PATENT DOCUMENTS

2011/0164638 A1* 7/2011 Yoshizumi ............ B82Y 20/00
372/45.01
2012/0269220 A1 10/2012 Kyono et al.

OTHER PUBLICATIONS

Dmitry Sizov et al., "Gallium Indium Nitride-Based Green Lasers", Journal of lightwave technology, vol. 30, No. 5, 2011 IEEE, Mar. 1, 2012, pp. 22.

* cited by examiner

LIGHT-EMITTING ELEMENT

CROSS REFERENCE TO RELATED APPLICATIONS

This application is a U.S. National Phase of International Patent Application No. PCT/JP2014/005646 filed on Nov. 10, 2014, which claims the benefit of Japanese Priority Patent Application No. JP 2013-239827 filed in the Japan Patent Office on Nov. 20, 2013. Each of the above-referenced applications is hereby incorporated herein by reference in its entirety.

TECHNICAL FIELD

The present disclosure relates to a light-emitting element.

BACKGROUND ART

Development for practical use of a semiconductor laser element emitting green light is intensively ongoing. The use can include, for example, an image display device or a pointer which has the semiconductor laser element as a light source. However, a true green semiconductor laser element that emits light with a wavelength of around 530 nm has not been put into practical use, but a solid laser which is expensive and has low efficiency has been used up until now. However, in recent years, a semiconductor laser element which is configured to have a GaN-based compound semiconductor and emits true green light is reported, and the practical use of the semiconductor laser element is expected.

In a light-emitting element made of a laminated structure of GaN-based compound semiconductor layers, a polar surface such as a (0001) c surface of the GaN substrate is often used as a main surface of a substrate for manufacturing the light-emitting element. However, when a light-emitting element in which, for example, an n-type GaN layer, an active layer made of InGaN, and a p-type GaN layer are laminated is manufactured by using a (0001) c surface of the GaN substrate as a main surface, a lattice constant of an InGaN crystal is slightly larger than a lattice constant of a GaN crystal. Accordingly, when the n-type GaN layer, the active layer, and the p-type GaN layer whose respective top faces are C surfaces are laminated, piezo spontaneous polarization occurs in a thickness direction of the active layer due to compression pressure applied on the active layer. As a result, a shift in a light emission wavelength from the light-emitting element, a decrease in light emission efficiency or luminance saturation occurs.

In order to avoid such a problem, a technology of using a semi-polar surface such as a (20-21) surface as a main surface of the GaN substrate for manufacturing a light-emitting element is well-known from, for example, PTL 1. Specifically, a semiconductor laser element disclosed in the patent publication includes a gallium nitride substrate which has the {20-21} surface as a first main surface, a nitride semiconductor thick film provided in contact with the first main surface of the gallium nitride substrate, and a nitride semiconductor laser element layer which is provided on the nitride semiconductor thick film, in which the nitride semiconductor laser element layer includes an n-type nitride semiconductor layer, a light emission layer which is made of a nitride semiconductor, and a p-type nitride semiconductor layer, and the nitride semiconductor thick film has a {-1017} surface which is within a range of making an angle from 89.95 degrees to 90.05 degrees with the {20-21} surface that is a main surface of the nitride semiconductor thick film.

Here, the nitride semiconductor thick film is provided to ease lattice distortion. In addition, since the nitride semiconductor thick film has a {-1017} surface within a range of making an angle alpha from 89.95 degrees to 90.05 degrees with the {20-21} surface which is a main surface of the nitride semiconductor thick film, it is possible to easily form a good resonator end surface on a nitride semiconductor laser element layer on the nitride semiconductor thick film by a cleavage. Therefore, it is said that it is possible to realize a low threshold current even when using the GaN substrate in which the {20-21} surface that is a semi-polar surface is set to a first main surface. Moreover, for example, marks of crystal surfaces in a hexagonal system illustrated below, are written as {hk-il} surface and {h-kil} surface for convenience in the present specification.
{h k $\bar{\text{i}}$ l} surface
{h $\bar{\text{k}}$ i l} surface

CITATION LIST

Patent Literature

[PTL 1]
Japanese Unexamined Patent Application Publication No. 2012-227361

SUMMARY

Technical Problem

Incidentally, a resonator end surface (a light-emitting end surface and a light-reflecting end surface) in a nitride semiconductor laser element layer of the semiconductor laser element disclosed in the above-mentioned patent publication is configured to have one plane. Specifically, it is assumed that while a cleavage proceeds from the GaN substrate to the nitride semiconductor laser element layer through a nitride semiconductor thick film, a cleavage surface is formed to be within a predetermined range (within a range of making an angle of 90 degrees plus-minus 0.05 degrees with respect to the {20-21} surface) in the nitride semiconductor thick film, and this state continues to the nitride semiconductor laser element layer, so that a good cleavage surface is formed. However, if each of the light-emitting end surface and the light-reflecting end surface is configured to have one plane in this manner, there is a problem where stray light is likely to occur. In addition, introduction of the nitride semiconductor thick film to ease lattice distortion deteriorates a crystallinity of a compound semiconductor layer formed on the nitride semiconductor thick film and causes a lot of dislocation and crystal defects to occur, and thus a problem is very likely to occur in reliability and lifetime of the semiconductor laser element.

Therefore, it is desirable to provide a light-emitting element of a configuration and a structure in which problems such as stray light and a decrease in reliability is not likely to occur.

Solution to Problem

A light-emitting element according to an embodiment of the present disclosure includes a laminated structure which is made by laminating a first compound semiconductor layer having a first conductivity type, a third compound semiconductor layer having an active layer, and a second compound semiconductor layer having a second conductivity type different from the first conductivity type, and has a light-emitting end surface and a light-reflecting end surface, in which the light-emitting end surface has at least a light-emitting end surface second region which is configured to have an end surface of the second compound semiconductor layer and a light-emitting end surface third region which is configured to have an end surface of the third compound semiconductor layer, and when an angle between a virtual vertical surface in the light-emitting end surface and the light-emitting end surface second region is set to theta$_2$, and an angle between the virtual vertical surface in the light-emitting end surface and the light-emitting end surface third region is set to theta$_3$, "absolute value of theta$_3$ is equal to or greater than 0 degree and smaller than absolute value of theta$_2$" is satisfied. Specifically, the laminated structure is formed on a light-emitting element manufacturing substrate during manufacture; however, the laminating order includes a laminating order of the first compound semiconductor layer, the third compound semiconductor layer, and the second compound semiconductor layer, and a laminating order of the second compound semiconductor layer, the third compound semiconductor layer, and the first compound semiconductor layer.

A light-emitting element according to another embodiment includes a laminated structure including a first compound semiconductor layer having a first conductivity type, a second compound semiconductor layer having a second conductivity type different than the first conductivity type, and a third compound semiconductor layer formed between the first and second compound semiconductor layers and including an active layer. A second end surface of the second compound semiconductor layer and a third end surface of the third compound semiconductor layer are formed at respective second and third angles theta$_2$ and theta3 relative to a virtual vertical direction of the laminated structure and satisfy the following relationship: "absolute value of theta$_3$ is equal to or greater than 0 degree and smaller than absolute value of theta$_2$".

In another embodiment, a light-emitting element includes a laminated structure including a first compound semiconductor layer having a first conductivity type, a second compound semiconductor layer having a second conductivity type different than the first conductivity type, and a third compound semiconductor layer formed between the first and second compound semiconductor layers and including an active layer. A first end surface of the first compound semiconductor layer, a second end surface of the second compound semiconductor layer, and a third end surface of the third compound semiconductor layer are formed at respective first, second and third angles theta1, theta2 and theta3 relative to a virtual vertical direction of the laminated structure and satisfy the following relationships: |theta2−theta3| is greater than 2.0 degrees; and |theta1−theta3| is greater than 0.0 degrees.

Advantageous Effects of Invention

In the light-emitting element of the present disclosure, at least a relationship of angles theta$_2$ and theta$_3$ which are made respectively between a light-emitting end surface second region and a virtual vertical surface in a light-emitting end surface, and between a light-emitting end surface third region and the virtual vertical surface in the light-emitting end surface is defined, such that stray light is unlikely to occur when light occurring in an active layer reciprocates between the light-emitting end surface and the light-reflecting end surface. Moreover, the introduction of the compound semiconductor layer to ease lattice distortion is not necessary, and it is possible to provide the light-emitting element which has high reliability and a long lifetime. An effect described in the specification is only an exemplification, but is not limited thereto, and there may be an additional effect.

DESCRIPTION OF EMBODIMENTS

Hereinafter, the present disclosure will be described based on Examples referring to drawings; however, the present disclosure is not limited to the examples, and various numerical values and materials in the examples are exemplifications. Description will be performed in the following order.

1. Description of an entire light-emitting element of the present disclosure.
2. Example 1 (a light-emitting element of the present disclosure) and the others.
[Description of Entire Light-Emitting Element of the Present Disclosure]

In a following description, a laminated structure is formed on a light-emitting element manufacturing substrate, and an end surface (vertical surface) of the light-emitting element manufacturing substrate when cutting the light-emitting element manufacturing substrate by a virtual vertical surface in the light-emitting end surface is assumed. Then, on a basis of the vertical surface, values of angles theta$_2$ and theta$_3$ or an angle theta$_1$ to be described below in a direction in which the light-emitting end surface outwardly protrudes, are assumed to be positive, and values of angles theta$_2$, theta$_3$, and theta$_1$ in a direction in which the light-emitting end surface inwardly retracts are assumed to be negative. Moreover, the light-reflecting end surface includes at least the light-reflecting end surface second region which is configured to have an end surface of the second compound semiconductor layer, and the light-reflecting end surface third region which is configured to have an end surface of the third compound semiconductor layer, and when setting an angle between the light-reflecting end surface and the light-reflecting end surface second region to theta$_2$', and setting an angle between the light-reflecting end surface and the light-reflecting end surface third region to theta$_3$', values of angles theta$_2$' and theta$_3$' in a direction in which the light-reflecting end surface outwardly protrudes are assumed to be negative, and values of angles theta$_2$' and theta$_3$' in a direction in which the light-reflecting end surface inwardly retracts are assumed to be positive. A unit of angles is "degrees".

In the light-emitting element of the present disclosure, it is preferable to satisfy "absolute value of theta$_3$ is equal to or smaller than 2.0 degrees", and desirably, "absolute value of theta$_3$ is equal to or smaller than 1.0 degree". In other words, it is preferable to satisfy "absolute value of theta$_3$ is equal to equal to or greater than −2.0 degrees and equal to or smaller than 2.0 degrees", and desirably, "theta$_3$ is equal to equal to or greater than −1.0 degrees and equal to or smaller than 1.0 degree".

In addition, in the light-emitting element of the present disclosure which includes the above-mentioned preferred embodiments, it is preferable to satisfy "absolute value of (theta$_2$−theta$_3$) is greater than 2.0 degrees", and desirably, "absolute value of (theta$_2$−theta$_3$) is greater than 3.0 degrees". That is, it is preferable to satisfy "theta$_2$−theta$_3$ is greater than 2.0 degrees" or "theta$_2$−theta$_3$ is smaller than −2.0 degrees", and desirably, "theta$_2$−theta$_3$ is greater than 3.0 degrees" or "theta$_2$−theta$_3$ is smaller than −3.0 degrees".

In the light-emitting element of the present disclosure which includes the preferred embodiments described above, the laminated structure can be formed from an AlGaInN-based compound semiconductor. Then, in this case, the second compound semiconductor layer has a negative value of an amount of lattice distortion with respect to GaN, and can be configured from a mixed crystal in which an absolute value of the amount of lattice distortion is 0.02% or more. By configuring the second compound semiconductor layer from such a mixed crystal, it is possible to reliably achieve a relationship of "absolute value of (theta$_2$−theta$_3$) is greater than 2.0 degrees". Moreover, the active layer includes an InGaN layer. In addition, the second compound semiconductor layer can be configured to have at least an Al$_X$In$_Y$Ga$_{(1-X-Y)}$N layer (where, X>0, Y is equal to or greater than 0). That is, specifically, it is preferable that the second compound semiconductor layer be configured to have the Al$_X$In$_Y$Ga$_{(1-X-Y)}$N layer (where, X>0, Y is equal to or greater than 0), or the Al$_X$In$_Y$Ga$_{(1-X-Y)}$N layer (where, X>0, Y is equal to or greater than 0) and an Al$_P$In$_Q$Ga$_{(1-P-Q)}$N layer (where, P is equal to or greater than 0, Q is equal to or greater than 0).

Furthermore, in the light-emitting element of the present disclosure which includes preferred embodiments and configurations described above, the light-emitting end surface further includes a light-emitting end surface first region which is configured to have an end surface of the first compound semiconductor layer, and when setting an angle between the virtual vertical surface in the light-emitting end surface and the light-emitting end surface first region to theta$_1$, it is preferable to satisfy "absolute value of theta$_3$ is equal to or greater 0 degree and equal to or smaller than absolute value of theta$_1$". In this case, it is preferable to satisfy |theta$_1$−theta$_3$|>0 degree, and desirably, "absolute value of (theta$_1$−theta$_3$) is greater than 1.0 degree". That is, desirably, it is preferable to satisfy "theta$_1$−theta$_3$ is greater than 1.0 degree" or theta$_1$−theta$_3$ is smaller than −1.0 degree". In addition, the first compound semiconductor layer can be configured to have a single layer or a plurality of layers of an Al$_{X'}$In$_{Y'}$Ga$_{(1-X'-Y')}$N layer (where, X' is equal to or greater than 0, Y' is equal to or greater than 0). Specific examples of the latter include a configuration in which, for example, a GaN layer/an Al$_{X'}$In$_{Y'}$Ga$_{(1-X'-Y')}$N layer (where, X'>0, Y' is equal to or greater than 0)/a GaN layer are laminated. The active layer which configures a third compound semiconductor layer includes an InGaN layer, such that, as a whole, a value of an amount of lattice distortion with respect to GaN is positive. Accordingly, even when the value of an amount of lattice distortion with respect to GaN of the first compound semiconductor layer is zero, the first compound semiconductor layer has a relatively negative amount of lattice distortion with respect to a third compound semiconductor layer. Therefore, as described above, there is an angle difference between theta$_3$ and theta$_1$.

In the light-emitting element of the present disclosure which includes the preferred embodiments and configurations described above, the laminated structure is formed on a light-emitting element manufacturing substrate which is made of a GaN substrate having a semi-polar or non-polar main surface (specifically, an independent type or free-standing GaN substrate). That is, the laminated structure is preferably formed on the semi-polar or the non-polar main surface of the GaN substrate; however, where the laminated structure is formed is not limited to the GaN substrate. Then, in this case, where the laminated structure is formed is not limited to the GaN substrate, but the laminated structure can be formed on, for example, the {20-21} surface, a {1-102}r surface, a {1-101} surface, a {11-22} surface, a {2-201} surface, and a {0001} surface of the GaN substrate. Furthermore, the laminated structure can be formed on a GaN substrate (specifically, for example, on the {20-21} surface, the {1-102}r surface, the {1-101} surface, the {11-22} surface, the {2-201} surface, and the {0001} surface of an n-type GaN substrate) by laminating the first compound semiconductor layer, the third compound semiconductor layer, and the second compound semiconductor layer in this order. In this case, it is possible to exemplify an n-type as a first conductivity type, and to exemplify a p-type as a second conductivity type.

Moreover, in the light-emitting element of the present disclosure which includes the preferred embodiments and configurations described above, when setting an axial direction of the laminated structure from the light-emitting end surface towards the light-reflecting end surface to an X direction, and setting a thickness direction of the laminated structure to a Z direction, a cross-sectional shape of the light-reflecting end surface and a cross-sectional shape of the light-emitting end surface when cutting the laminated structure in an XZ virtual plane can be formed to have a complementary shape to each other. That is, it is preferable to satisfy theta$_3$=theta$_2$' and theta$_3$=theta$_3$'. In addition, the light-reflecting end surface further includes the light-reflecting end surface first region configured to have an end surface of the first compound semiconductor layer, and when setting an angle between a virtual vertical surface in the light-reflecting end surface and the light-reflecting end surface first region to theta$_1$', it is preferable to satisfy theta$_1$=theta$_1$'. A virtual vertical surface in the light-emitting end surface, a virtual vertical surface in the light-reflecting end surface, and an end surface (vertical surface) of the light-emitting element manufacturing substrate are planes parallel to an YZ virtual plane. Moreover, a Y direction corresponds to a width direction of the laminated structure.

In the light-emitting element of the present disclosure which includes the preferred embodiments and configurations described above, the first compound semiconductor layer can be made of at least a first cladding layer, the third compound semiconductor layer can be made by laminating a first light guide layer, an active layer, and a second light guide layer from the first compound semiconductor layer side, and the second compound semiconductor layer can be made of at least a second cladding layer.

The first light guide layer and the second light guide layer are made of, for example, a non-doped GaInN layer. The first compound semiconductor layer and the second compound semiconductor layer may be a layer of a single structure, or a layer of a multi-layered structure, or may include a layer of a super lattice structure, a composition gradient layer, or a concentration gradient layer. Specifically, the second compound semiconductor layer can have a configuration in which a second cladding layer/contact layer (for example, Mg-doped GaN layer) are laminated or a configuration in which, for example, an $Al_XIn_YGa_{(1-X-Y)}N$ layer (where, X>0, Y is equal to or greater than 0) and a GaN layer are laminated. Moreover, the second compound semiconductor layer may have a structure having a step in a configuring layer or on a layer interface.

Moreover, in the light-emitting element of the present disclosure which includes the preferred embodiments and configurations described above without being limited, it is possible to have a form in which a wavelength of emitted light is 450 nm to 600 nm, and desirably, 500 nm to 550 nm.

In the light-emitting element of the present disclosure, it is possible to form the light-emitting end surface and the light-reflecting end surface using cleavage. Then, by controlling an amount of lattice distortion of the second compound semiconductor layer with respect to the third compound semiconductor layer, specifically, by controlling the content of aluminum (Al) or indium (In) in the second compound semiconductor layer when the active layer includes an InGaN layer and the second compound semiconductor layer includes an $Al_XIn_YGa_{(1-X-Y)}N$ layer (where, X>0, Y is equal to or greater than 0), it is possible to determine and control an angle $theta_2$ of the light-emitting end surface second region, an angle $theta_3$ of the light-emitting end surface third region, an angle $theta_2'$ of the light-reflecting end surface second region, and an angle $theta_3'$ of the light-reflecting end surface third region, which are formed using cleavage. In the same manner, by controlling an amount of lattice distortion of the first compound semiconductor layer with respect to the third compound semiconductor layer, specifically, by controlling the content of aluminum (Al) or indium (In) in the first compound semiconductor layer when the active layer includes the InGaN layer, and the first compound semiconductor layer includes an $Al_{X'}In_{Y'}Ga_{(1-X'-Y')}N$ layer (where, X'>0, Y' is equal to or greater than 0), it is possible to determine and control an angle $theta_1$ of the light-emitting end surface first region and an angle $theta_1'$ of the light-reflecting end surface first region, which are formed using cleavage.

A Miller index of the light-emitting end surface third region can include {-101 n} (where, n is any one of 6, 7, 8, 9) when forming the laminated structure on the {20-21} semi-polar surface of the GaN substrate. A measurement of an amount of lattice distortion in a compound semiconductor layer can be performed based on an X-ray diffraction method. Angles between each of a {-1016} surface, a {-1017} surface, a {-1018} surface, and a {-1019} surface and the {20-21} surface are 87.54 degrees, 89.90 degrees, 91.71 degrees, and 93.13 degrees.

When a thickness of the first compound semiconductor layer is set to $t_1$, and a thickness of the second compound semiconductor layer is set to $t_2$, it is preferable that values of $t_1$ and $t_2$ be 20 nm or more.

As a light-emitting element in the present disclosure, specifically, it is possible to exemplify a semiconductor laser element of an end surface-emitting type or super luminescent diode (SLD), and a semiconductor optical amplifier. Here, in the semiconductor laser element, light reflectance on the light-emitting end surface and light reflectance on the light-reflecting end surface are optimized, and thereby a resonator is configured. The semiconductor laser element can include a semiconductor laser element of a bi-section type or a multi-section type (multi electrode type) in which a light-emitting region and a saturable absorption region are arranged in a resonator direction, a semiconductor laser element of a saturable absorber layer (SAL) type in which the light-emitting region and the saturable absorption region are arranged in a vertical direction, and a semiconductor laser element of a weakly index guide (WI) type in which a saturable absorption region is provided along a ridge stripe structure. On the other hand, in a super luminescent diode, light reflectance on the light-emitting end surface is set to a very low value, light reflectance on the light-reflecting end surface is set to a very high value, and light generated in the active layer is reflected on the light-reflecting end surface and is emitted from the light-emitting end surface without configuring a resonator. Moreover, a semiconductor optical amplifier performs an amplification in a state of direct light without converting a light signal into an electric signal, has a laser structure in which a resonator effect is removed as much as possible, and amplifies incident light based on light gain of the semiconductor optical amplifier.

The semiconductor laser element includes a semiconductor laser element which has a separate confinement heterostructure (SCH structure) of a ridge stripe type. Alternatively, it is possible to exemplify a semiconductor laser element which has a separate confinement heterostructure of a diagonal ridge stripe type. That is, an axis of the semiconductor laser element can meet an axis of the ridge stripe structure at a predetermined angle. Here, as a predetermined angle phi, it is possible to exemplify "phi is equal to or greater than 0.1 degree and equal to or smaller than 10 degrees". An axis of the ridge stripe structure is a straight line which connects a midpoint of both ends of the ridge stripe structure in the light-emitting end surface and a midpoint of both ends of the ridge stripe structure in the light-reflecting end surface. In addition, an axis of the semiconductor laser element refers to an axis which is orthogonal to a virtual vertical surface in the light-emitting end surface and a virtual vertical surface in the light-reflecting end surface. A planar shape of the ridge stripe structure may be in a straight shape, and may be in a curved shape. Alternatively, it is possible to exemplify a semiconductor laser element which has a separate confinement heterostructure of a tapered (flared) ridge stripe type (for example, including a configuration of being gently widened in a tapered shape monotonically from the light-emitting end surface towards the light-reflecting end surface, and a configuration of being first widened, exceeding a maximum width, and being narrowed from the light-emitting end surface to the light-reflecting end surface). The ridge stripe structure may be configured to have only the second compound semiconductor layer, may be configured to have the second compound semiconductor layer and the third compound semiconductor layer, or may be configured to have the second compound semiconductor layer, the third compound semiconductor layer, and a portion of the first compound semiconductor layer in a thickness direction. However, the semiconductor laser element is not limited to these structures.

In general, an anti-reflection coating layer (AR) or a low reflection coating layer is formed on the light-emitting end surface. Moreover, a high reflection coating layer (HR) is formed on the light-reflecting end surface. The anti-reflection coating layer (low reflection coating layer) can include a laminated structure of at least two types selected from a group including a titanium oxide layer, a tantalum oxide layer, a zirconium oxide layer, a silicon oxide layer, an aluminum oxide layer, an aluminum nitride layer, and a silicon nitride layer.

More specifically, the AlGaInN-based compound semiconductor can include GaN, AlGaN, GaInN, and AlGaInN. Furthermore, a boron (B) atom and a thallium atom (Tl), an arsenic (As) atom, a phosphorus (P) atom, and an antimony (Sb) atom may be included in these compound semiconductors, if desired. Moreover, it is desirable that the active layer have a quantum well structure. Specifically, the active layer may have a single quantum well structure (SQW structure), and may have a multi-quantum well structure (MQW structure). In the active layer which has the quantum well structure, a well layer and a barrier layer have a structure in which at least one layer is laminated. However, as a combination of (a compound semiconductor configuring the well layer and a compound semiconductor configuring the barrier layer), it is possible to exemplify (InGaN, GaN) or (InGaN, AlInGaN), (InGaN, InGaN) [however, a composition of InGaN configuring the well layer is different from a composition of InGaN configuring the barrier layer]. Furthermore, the barrier layer may be configured to have a layer group which has a plurality of compositions.

Methods of forming various types of compound semiconductor layers which configure the light-emitting element (specifically, the AlGaInN-based compound semiconductor layer) include an organic metal chemical vapor phase growth method (MOCVD method, MOVPE method) or a molecular beam epitaxy method (MBE method), a hydride vapor phase growth method in which halogen contributes to a transport or a reaction, and the like. Here, an organic gallium source gas in the MOCVD method can include a trimethyl gallium (TMG) gas and a triethyl gallium (TEG) gas, and a nitrogen source gas can include an ammonia gas and a hydrazine gas. Moreover, for example, silicon (Si) may be added as an n-type impurity (n-type dopant) in a formation of a GaN-based compound semiconductor layer which has an n-type conductivity type, and, for example, magnesium (Mg) may be added as a p-type impurity (p-type dopant) in a formation of a GaN-based compound semiconductor layer which has a p-type conductivity type. Moreover, when aluminum (Al) or indium (In) is included as a configuration atom of the GaN-based compound semiconductor layer, trimethylaluminum (TMA) gas may be used as an Al source, and a trimethyl indium (TMI) gas may be used as an In source. Moreover, monosilane ($SiH_4$ gas) may be used as a Si source, and cyclopentadienyl magnesium gas or methyl cyclopentadienyl magnesium, and biscyclopentadienylmagnesium ($Cp_2Mg$) may be used as an Mg source. It is possible to exemplify Ge, Se, Sn, C, Te, S, O, Pd, Po besides Si as the n-type impurity (n-type dopant), and to exemplify Zn, Cd, Be, Ca, Ba, C, Hg, and Sr besides Mg as the p-type impurity (p-type dopant).

In a laminated structure in which the first compound semiconductor layer, the third compound semiconductor layer, and the second compound semiconductor layer are laminated on the light-emitting element manufacturing substrate in this order, the first compound semiconductor layer is electrically connected to a first electrode, and the second compound semiconductor layer is electrically connected to a second electrode. When the first conductivity type is set to an n-type, and the second conductivity type is set to a p-type, the second electrode includes at least one type of metal (including an alloy) selected from a group including, for example, palladium (Pd), nickel (Ni), platinum (Pt), gold (Au), cobalt (Co), and rhodium (Rh), and can be realized in a form of a single layer configuration or a multi-layered configuration (for example, a laminated structure of a palladium layer/a platinum layer in which the palladium layer is in contact with the second compound semiconductor layer, or a laminated structure of the palladium layer/a nickel layer in which the palladium layer is in contact with the second compound semiconductor layer). The first electrode preferably has a single layer configuration or a multi-layered configuration including at least one type of metal (including an alloy) selected from a group including, for example, gold (Au), silver (Ag), palladium (Pd), platinum (Pt), nickel (Ni), aluminum (Al), titanium (Ti), tungsten (W), vanadium (V), chromium (Cr), copper (Cu), zinc (Zn), tin (Sn), and indium (In), and it is possible to exemplify, for example, Ti/Au, Ti/Al, Ti/Pt/Au, Ti/Al/Au, Ti/Pt/Au, Ni/Au, Ni/Au/Pt, Ni/Pt, Pd/Pt, and Ag/Pd. As a layer is before "/" in the multi-layered configuration, the layer is positioned closer to the active layer side. The following description will be provided in the same manner. The first electrode is electrically connected to the first compound semiconductor layer; however, a form in which the first electrode is formed on the first compound semiconductor layer and a form in which the first electrode is connected to the first compound semiconductor layer through a conductive material layer or a conductive light-emitting element manufacturing substrate and the like are included. The first electrode or the second electrode can be formed by a PVD method such as a vacuum evaporation method or a sputtering method.

On the first electrode and the second electrode, a pad electrode may be provided so as to be electrically connected to an external electrode or a circuit. It is desirable that the pad electrode have a single layer configuration or a multi-layered configuration including at least one type of metal (including an alloy) selected from a group including titanium (Ti), aluminum (Al), platinum (Pt), gold (Au), nickel (Ni), and palladium (Pd). Alternatively, the pad electrode can be realized in a multi-layered configuration such as a multi-layered configuration of Ti/Pt/Au, a multi-layered configuration of Ti/Au, a multi-layered configuration of Ti/Pd/Au, a multi-layered configuration of Ti/Pd/Au, a multi-layered configuration of Ti/Ni/Au, and a multi-layered configuration of Ti/Ni/Au/Cr/Au.

Example 1

Figure 1:
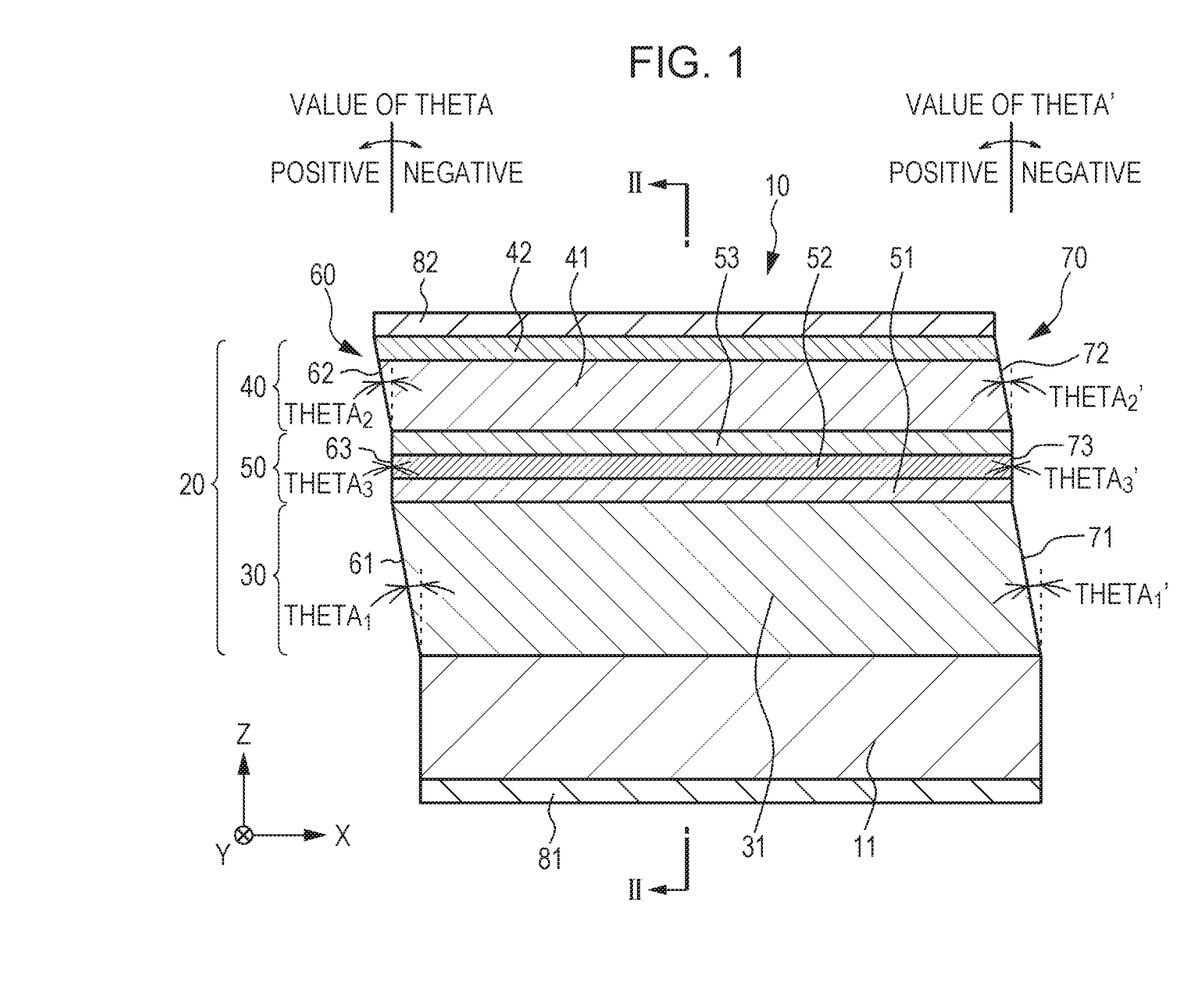
FIG. 1 is a schematic cross-sectional view when cutting a light-emitting element of Example 1 in an XZ virtual plane.
Figure 2:
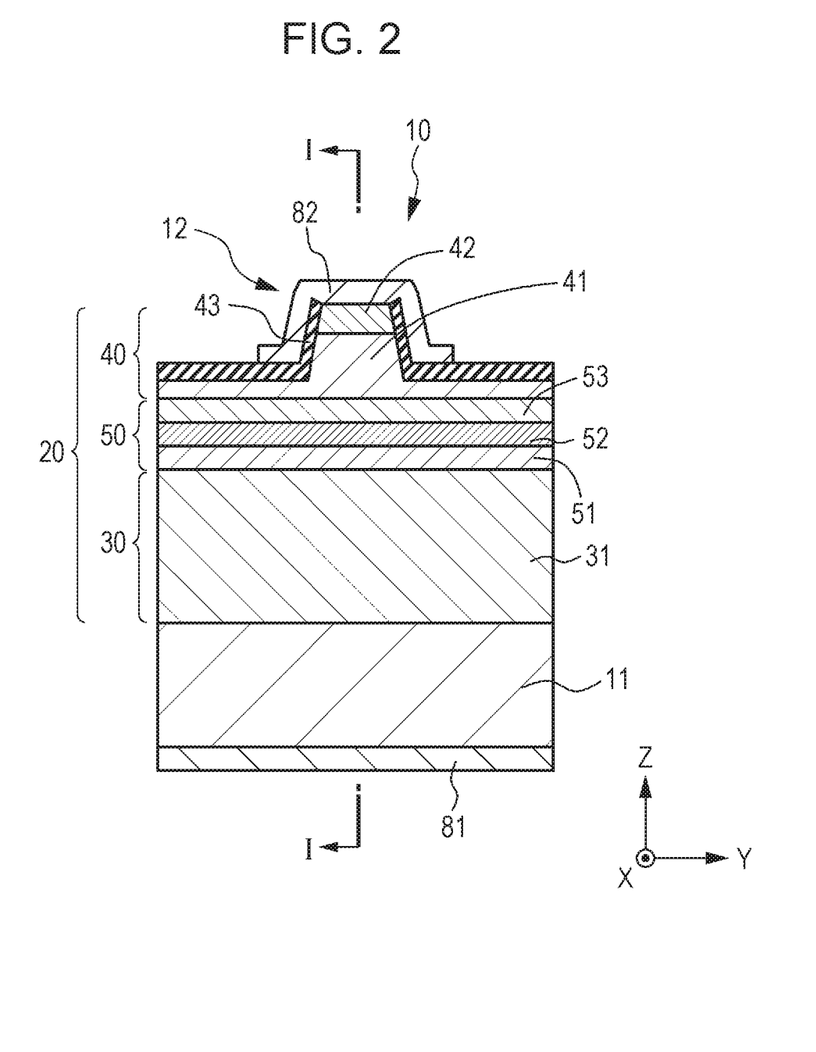
FIG. 2 is a schematic cross-sectional view when cutting the light-emitting element of Example 1 in an YZ virtual plane.

Example 1 relates to a light-emitting element of the present disclosure. A schematic cross-sectional view when cutting the light-emitting element of Example 1 in an XZ virtual plane is shown in FIG. 1, and a schematic cross-sectional view when cutting the light-emitting element of Example 1 in an YZ virtual plane is shown in FIG. 2. Moreover, FIG. 1 is a schematic cross-sectional view taken along an arrow I-I of FIG. 2, and FIG. 2 is a schematic cross-sectional view taken along an arrow II-II of FIG. 1.

The light-emitting element 10 of Example 1 is specifically a semiconductor laser element of an end surface-emitting type, more specifically, a semiconductor laser element which has a separate confinement heterostructure (SCH structure) of a ridge stripe type, and includes a laminated structure 20 which is made by laminating a first compound semiconductor layer 30 having a first conductivity type (specifically, n-type in Example 1), a third compound semiconductor layer 50 including an active layer 52, and a second compound semiconductor layer 40 which has a second conductivity type (specifically, p-type in Example 1) different from the first conductivity type, and includes the light-emitting end surface 60 and the light-reflecting end surface 70.

Then, the light-emitting end surface 60 includes at least a light-emitting end surface second region 62 which is configured to have an end surface of the second compound semiconductor layer 40, and a light-emitting end surface third region 63 which is configured to have an end surface of the third compound semiconductor layer 50. When an angle between a virtual vertical surface (YZ virtual plane) in the light-emitting end surface 60 and the light-emitting end surface second region 62 is set to theta$_2$, and an angle between the virtual vertical surface and the light-emitting end surface third region 63 is set to theta$_3$, "absolute value of theta$_3$ is equal to or greater than 0 degree and smaller than absolute value of theta$_2$" is satisfied, and furthermore, "absolute value of theta$_3$ is equal to or smaller than 2.0 degrees" and |theta$_2$−theta$_3$|>2.0 degrees are satisfied.

In addition, in the light-emitting element 10 of Example 1, the light-emitting end surface 60 further includes a light-emitting end surface first region 61 which is configured to have an end surface of the first compound semiconductor layer 30. When an angle between a virtual vertical surface (YZ virtual plane) in the light-emitting end surface 60 and the light-emitting end surface first region 61 is set to theta$_1$, "absolute value of theta$_3$ is equal to or greater 0 degree and equal to or smaller than absolute value of theta$_1$", preferably, |theta$_1$−theta$_3$|>0 degrees is satisfied.

Furthermore, a cross-sectional shape of the light-emitting end surface 60 when cutting the laminated structure 20 in the XZ virtual plane has a complementary shape to a cross-sectional shape of the light-reflecting end surface 70. That is, the light-reflecting end surface 70 has a light-reflecting end surface second region 72 configured to have an end surface of the second compound semiconductor layer 40, a light-reflecting end surface third region 73 configured to have an end surface of the third compound semiconductor layer 50, and a light-reflecting end surface first region 71 configured to have an end surface of the first compound semiconductor layer 30. When an angle between a virtual vertical surface (YZ virtual plane) in the light-reflecting end surface 70 and the light-reflecting end surface second region 72 is set to theta$_2$', an angle between the virtual vertical surface and the light-reflecting end surface third region 73 is set to theta$_3$', and an angle between the virtual vertical surface and the light-reflecting end surface first region 71 is set to theta$_1$', theta$_2$=theta$_2$', theta$_3$=theta$_3$', and theta$_1$=theta$_1$' are satisfied.

More specifically, theta$_1$=theta$_1$'=4.0 degrees, theta$_2$=theta$_2$'=0.0 degree, and theta$_3$=theta$_3$'=1.0 degree. In addition, the second compound semiconductor layer 40 has a negative value of an amount of lattice distortion with respect to GaN, and an absolute value of the amount of lattice distortion (distortion ratio) is 0.1%. A value of an amount of lattice distortion with respect to GaN of the first compound semiconductor layer 30 is zero.

The laminated structure 20 is formed on a light-emitting element manufacturing substrate. Specifically, the laminated structure 20 is formed on a light-emitting element manufacturing substrate made of a free-standing n-type GaN substrate 11 which has a semi-polar main surface, and more specifically, on the {20-21} surface of the n-type GaN substrate 11. However, without being limited thereto, the laminated structure 20 can be formed on, for example, a {1-102] r surface, a {1-101} surface, a {11-22} surface, a {2-201} surface, a {0001} surface, and the like. In other words, the laminated structure 20 is made by laminating the first compound semiconductor layer 30, the third compound semiconductor layer 50, and the second compound semiconductor layer 40 on the GaN substrate 11 in this order, specifically, on the {20-21} surface of the n-type GaN substrate 11 (alternatively, on the {1-102} r surface, the {1-101} surface, the {11-22} surface, the {2-201} surface, the {0001} surface, and the like).

In the light-emitting element 10 of Example 1, the first compound semiconductor layer 30 is made of at least a first cladding layer 31, the third compound semiconductor layer 50 is made by laminating the first light guide layer 51, the active layer 52, and the second light guide layer 53 from the first compound semiconductor layer side, and the second compound semiconductor layer 40 is made of at least a second cladding layer 41.

More specifically, the light-emitting element 10 of Example 1 is a GaN-based semiconductor laser element of an index-guided type, and includes the ridge stripe structure 12. Then, the laminated structure 20, that is, the first compound semiconductor layer 30, the third compound semiconductor layer 50, and the second compound semiconductor layer 40 are specifically made of an AlGaInN-based compound semiconductor. Here, the second compound semiconductor layer 40 has a negative value of an amount of lattice distortion with respect to GaN, and is made of a mixed crystal which has 0.02% or more of an absolute value of the amount of lattice distortion. A thickness of the second compound semiconductor layer 40 is 20 nm or more. Furthermore, the active layer 52 includes an InGaN layer, and the second compound semiconductor layer 40 includes at least an Al$_X$In$_Y$Ga$_{(1-X-Y)}$N layer (where, X>0, Y is equal to or greater than 0). In addition, the first compound semiconductor layer 30 is made of a mixed crystal which has a zero value of an amount of lattice distortion with respect to GaN. A thickness of the first compound semiconductor layer 30 is 20 nm or more. Specifically, the first compound semiconductor layer 30 includes an Al$_{X'}$In$_{Y'}$Ga$_{(1-X'-Y')}$N layer (where, X' is equal to or greater than 0, Y' is equal to or greater than 0). More specifically, the laminated structure 20 has a layer configuration shown in Table 1 below. As a compound semiconductor layer is described below in Table 1, the layer is a layer close to the n-type GaN substrate 11. A wavelength of laser light emitted from a semiconductor laser element which is the light-emitting element 10 is 530 nm. As described above, the laminated structure is formed on the semi-polar surface of the GaN substrate 11, and the laminated structure 20 is made by laminating the first compound semiconductor layer 30, the third compound semiconductor layer 50, and the second compound semiconductor layer 40 on the GaN substrate 11 in this order.

Figure 3:
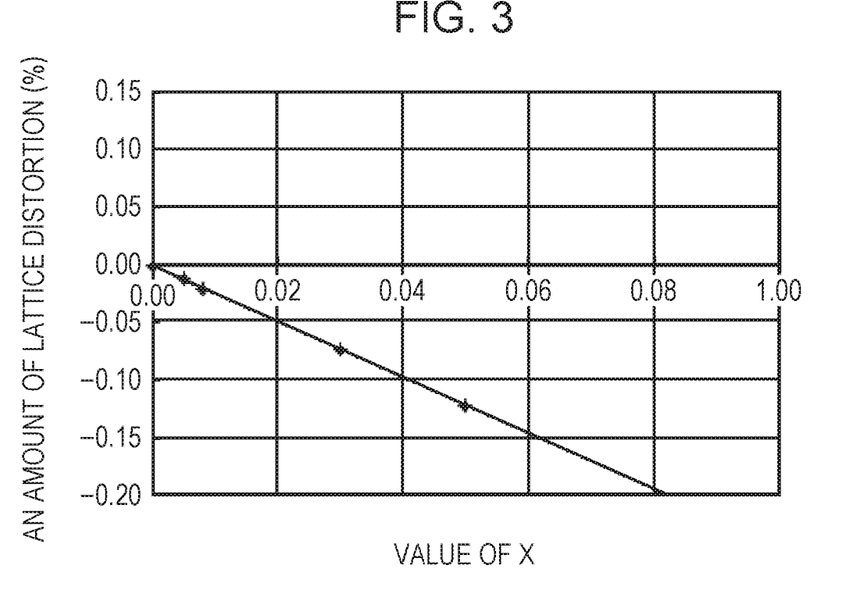
FIG. 3 is a graph that shows a relationship between a composition X of aluminum (Al) and an amount of lattice distortion of $Al_XGa_{(1-X)}N$ mixed crystal layer when forming the $Al_XGa_{(1-X)}N$ mixed crystal layer on a GaN substrate.
Figure 4:
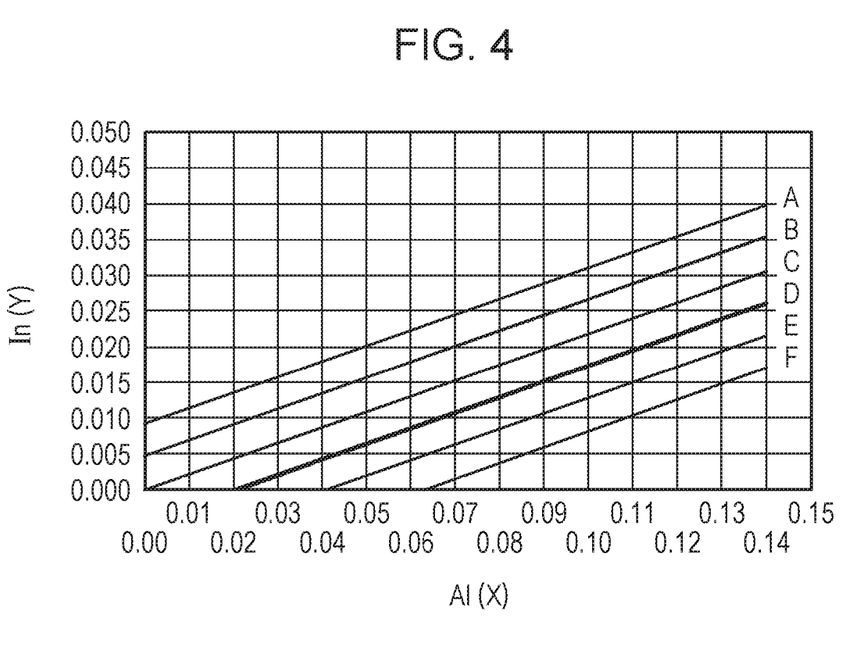
FIG. 4 is a graph which shows an amount of lattice distortion with respect to GaN while setting compositions X and Y to parameters when forming an $Al_XIn_YGa_{(1-X-Y)}N$ mixed crystal layer on the GaN substrate.
Figure 5:
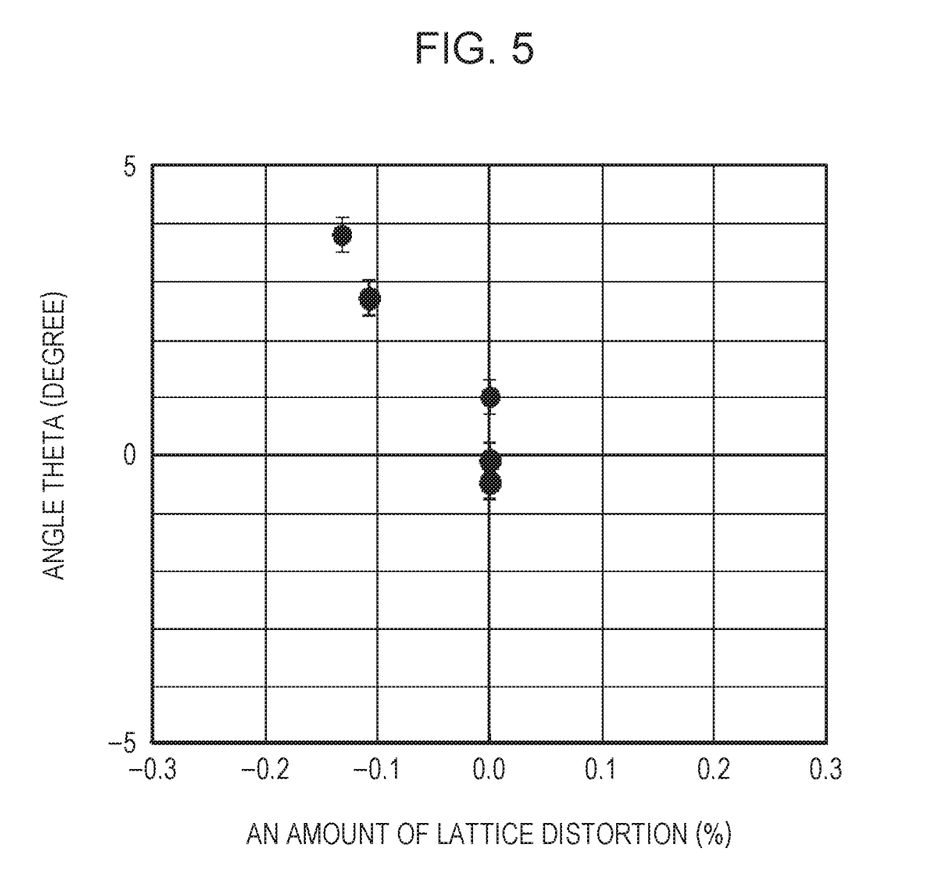
FIG. 5 is a graph which shows a result of examining a relationship between an amount of lattice distortion of a compound semiconductor layer and an angle theta.

In Al$_X$Ga$_{(1-X)}$N on the GaN substrate, a lattice constant is decreased as a value of X is increased, and an amount of lattice distortion with respect to GaN is increased (refer to FIG. 3). In addition, in a case of Al$_X$In$_Y$Ga$_{(1-X-Y)}$N, an amount of lattice distortion with respect to GaN is as shown in FIG. 4, while setting compositions X and Y as parameters. In FIG. 4, a straight line "A" shows +0.10% of an amount of lattice distortion, a straight line "B" shows +0.05% of the amount of lattice distortion, a straight line "C" shows 0.00% of the amount of lattice distortion, a straight line "D" shows −0.05% of the amount of lattice distortion, a straight line "E" shows −0.10% of the amount of lattice distortion, and a straight line "F" shows −0.15% of the amount of lattice distortion. Accordingly, for example, a composition giving −0.05% of the amount of lattice distortion, in the case of Al$_X$Ga$_{(1-X)}$N, has an X value which is 0.02 from FIGS. 3 and 4. Moreover, for example, a composition giving −0.05% or less of the amount of lattice distortion, in the case of $Al_X In_Y Ga_{(1-X-Y)}N$, has an X value which is equal to or greater than 0.02 and a Y value which is equal to or greater than 0 from FIG. 4. That is, the composition becomes a (X,Y) region interposed by a straight line "D" and an X axis in FIG. 4. Furthermore, by laminating a compound semiconductor layer made of $Al_X Ga_{(1-X)}N$ or $Al_X In_Y Ga_{(1-X-Y)}N$ on the GaN substrate, a relationship between an amount of lattice distortion of each compound semiconductor layer and an angle theta between each compound semiconductor layer and a vertical surface with respect to a substrate is examined and a result shown in FIG. 5 is obtained. From the result, it is found that an angle can be controlled by an amount of lattice distortion.

TABLE 1

The second compound semiconductor layer 40
a contact layer (Mg-doped) 42
a p-type GaN
The second cladding layer (Mg-doped) 41
a p-type AlGaN which is 0.2 micro meter to 0.4 micro meter in thickness,
a third compound semiconductor layer 50 (entire thickness: 0.1 micro meter to 0.3 micro meter)
the second light guide layer 53
a non-doped GaInN
The quantum well active layer 52
(well layer: InGaN/barrier layer: InGaN)
the first light guide layer 51
a non-doped GaInN
The first compound semiconductor layer 30
a first cladding layer (Si-doped) 31
an n type AlGaN which is 0.5 micro meter to 1.5 micro meter in thickness In addition, portions of the p-type GaN contact layer 42 and the p-type AlGaN second cladding layer 41 are removed by an RIE method, and the ridge stripe structure 12 is formed. The laminated insulating film 43 which is made of $SiO_2$/Si is formed at both sides of the ridge stripe structure 12. A $SiO_2$ layer is a lower layer, and a Si layer is an upper layer. Then, a second electrode (p-side ohmic electrode) 82 is formed on the p-type GaN contact layer 42 corresponding to the top face of the ridge stripe structure 12. On the other hand, a first electrode (n-side ohmic electrode) 81 which is made of Ti/Pt/Au is formed on a rear surface of the n-type GaN substrate 11. In addition, an anti-reflection coating layer (AR) is formed on the light-emitting end surface 60. On the other hand, a high reflection coating layer (HR) is formed on a light-reflecting end surface 70 which faces the light-emitting end surface 60. The anti-reflection coating layer (low reflection coating layer) can include a laminated structure of at least two types of layers selected from a group including a titanium oxide layer, a tantalum oxide layer, a zirconium oxide layer, a silicon oxide layer, and an aluminum oxide layer.

The light-emitting element 10 of Example 1 can be manufactured using, for example, the following method.
[Process-100]
First, a laminated structure that is made by sequentially laminating the first compound semiconductor layer 30 which has a first conductivity type (n-type conductivity type) and is made of a GaN-based compound semiconductor, the third compound semiconductor layer 50 which is made of the GaN-based compound semiconductor, and the second compound semiconductor layer 40 which has a second conductivity type (p-type conductivity type) different from the first conductivity type and is made of the GaN-based compound semiconductor is formed on a (20-21) surface of the n-type GaN substrate 11 based on an existing MOCVD method.

[Process-110]
Subsequently, the ridge stripe structure 12 is formed by forming a mask for etching on the second compound semiconductor layer 40 and etching at least a portion of the second compound semiconductor layer 40 (specifically, etching a portion of the second compound semiconductor layer 40). More specifically, a portion of the second compound semiconductor layer 40 is etched based on an RIE method using $Cl_2$ gas.
[Process-120]
Thereafter, after forming the laminated insulating film 43 which covers an entire surface, the laminated insulating film 43 on a portion of the second compound semiconductor layer 40 which is positioned on the top face of the ridge stripe structure 12 is removed based on an etching method, and a second electrode 82 is formed on a portion of an exposed second compound semiconductor layer 40 based on an existing method. In addition, a first electrode 81 is formed on a rear surface of the GaN substrate 11 based on an existing method.
[Process-130]
Thereafter, it is possible to make the light-emitting element (semiconductor laser element) 10 of Example 1 by performing cleavage and the like of the GaN substrate 11 and furthermore performing packaging.

The top face of each compound semiconductor layer which configures the laminated structure 20 is a {-101n} surface (where, n is, for example, 7). Then, the light-emitting end surface 60 and the light-reflecting end surface 70 can be formed by cleavage. Moreover, by controlling an amount of lattice distortion of the second compound semiconductor layer 40 with respect to the third compound semiconductor layer 50, and an amount of lattice distortion of the first compound semiconductor layer 30 with respect to the third compound semiconductor layer 50, specifically, since the active layer 52 includes an InGaN layer, the second compound semiconductor layer 40 includes at least an $Al_X In_Y Ga_{(1-X-Y)}N$ layer (where X>0, Y is equal to or greater than 0), and the first compound semiconductor layer 30 includes an $Al_{X'} In_{Y'} Ga_{(1-X'-Y')}N$ layer (where, X'>0, Y' is equal to or greater than 0), by controlling the content of aluminum (Al) and indium (In) in the second compound semiconductor layer 40 and the first compound semiconductor layer 30, it is possible to determine and control an angle $theta_2$ of the light-emitting end surface second region 62, an angle $theta_3$ of the light-emitting end surface third region 63, an angle $theta_1$ of the light-emitting end surface first region 61, an angle $theta_{2'}$ of the light-reflecting end surface second region 72, an angle $theta_3'$ of the light-reflecting end surface third region 73, and an angle $theta_1'$ of the light-reflecting end surface first region 71, which are formed by a cleavage. Then, as described above, it is found that an amount of lattice distortion can be controlled and thereby an angle can be controlled.

Then, in the light-emitting element of Example 1, at least a relationship of $theta_2$, $theta_3$ which are respectively an angle between the light-emitting end surface of the light-emitting end surface second region and the virtual vertical surface and an angle between the light-emitting end surface of the light-emitting end surface third region and the virtual vertical surface is defined, such that stray light is unlikely to occur when light occurring in the active layer reciprocates between the light-emitting end surface and the light-reflecting end surface. As a result, it is possible to prevent an undesired mode from being included in the emitted light, and to prevent noise from occurring in a light emission profile. Furthermore, since it is possible to set the angle $theta_3$ to a value close to 0 degrees, it is possible to obtain laser oscillation at a low threshold and to achieve high light emission efficiency. Moreover, an introduction of a compound semiconductor layer to ease lattice distortion is not necessary, and it is possible to provide a light-emitting element which has high reliability and a long lifetime. Moreover, if a laminated structure is formed on a semi-polar surface such as the (20-21) surface of the n-type GaN substrate, even if piezoelectric polarization and spontaneous polarization occur on the active layer, the piezo polarization of the active layer in a thickness direction can be smaller than that of a (0001) c surface which is a polar surface, and it is possible to reduce adverse effects caused by the piezo polarization and the spontaneous polarization.

In the above, the present disclosure is described based on a preferred example; however, the present disclosure is not limited to the example. A configuration of the light-emitting element described in Example, and a configuration of a structure are merely examples, and can be appropriately modified and changed. Moreover, various values are shown in Example. These values are also merely examples, and can be changed when a specification of the light-emitting element is changed. It is also possible to configure a super luminescent diode (SLD) or a semiconductor optical amplifier from the light-emitting element. A configuration and a structure of the SLD & the semiconductor optical amplifier can be substantially the same as the configuration and the structure of the light-emitting element described in Example 1 except that light reflectance on the light-emitting end surface is different from the light reflection on the light-reflecting end surface.

Figure 6:
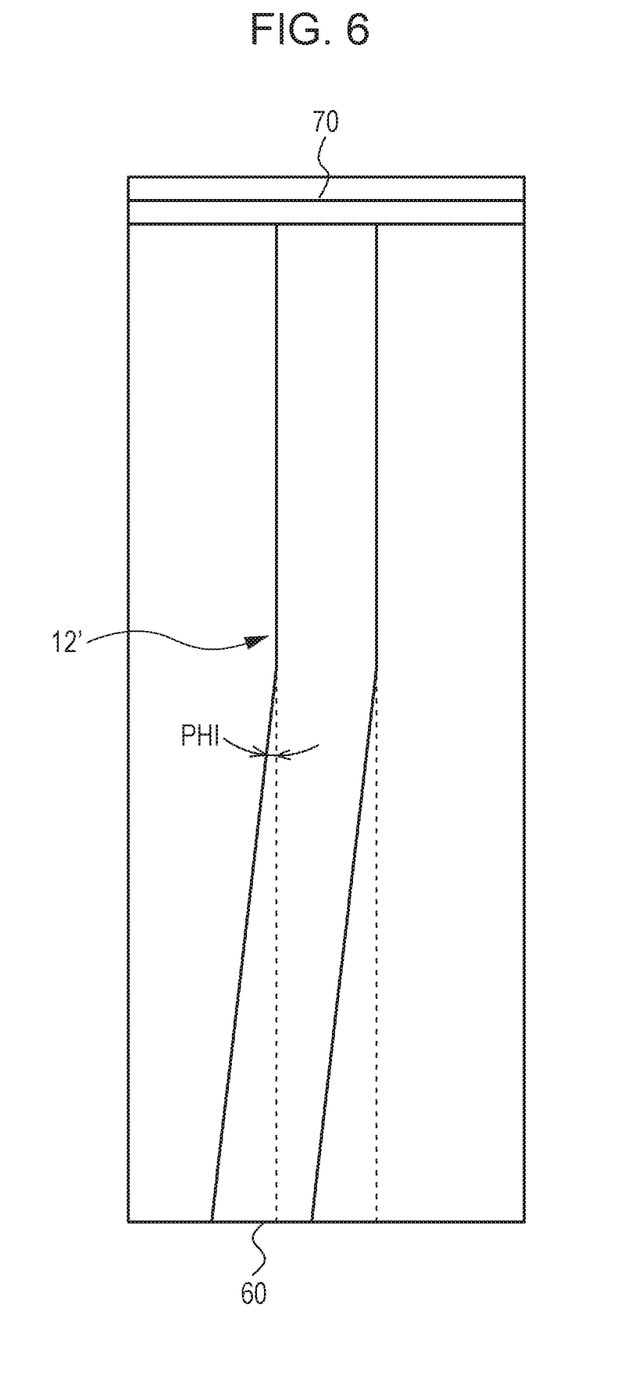
FIG. 6 is a schematic view of a ridge stripe structure in a modification example of the light-emitting element of Example 1 viewed from above.

It is possible to configure a semiconductor laser element as a semiconductor laser element of a separate confinement heterostructure of a diagonal ridge stripe type which has a diagonal waveguide. A schematic view of the ridge stripe structure 12' in the semiconductor laser element viewed from the above is shown in FIG. 6. It is desirable that the semiconductor laser element have a structure in which two ridge stripe structures in a straight line shape are combined, and that a value of an angle phi which is made by an intersection of the two ridge stripe structures be "phi is greater than 0 and equal to or smaller than 10 (degrees)", and preferably, "phi is greater than 0 and equal to or smaller than 6 (degrees)". By adopting the diagonal ridge stripe type, reflectance on the light-emitting end surface on which a non-reflection coating is performed can further approach an ideal value of 0%. As a result, it is possible to prevent a laser beam orbiting in a semiconductor laser element from occurring, and to obtain an advantage that a secondary laser beam associated with the main laser beam can be suppressed not to be generated.

Alternatively, a planar shape of the ridge stripe structure in the light-emitting element may be a tapered shape or a flared shape. Specifically, the planar shape of the ridge stripe structure can be realized in a configuration of being gently widened in a tapered shape, for example, monotonically from the light-emitting end surface towards the light-reflecting end surface, and in a configuration of being first widened, exceeding a maximum width, and being narrowed from the light-emitting end surface towards the light-reflecting end surface.

The present disclosure can have a configuration as follows.

[01] <<Light-Emitting Element>> A light-emitting element includes a laminated structure which is made by laminating a first compound semiconductor layer having a first conductivity type, a third compound semiconductor layer having an active layer, and a second compound semiconductor layer having a second conductivity type different from the first conductivity type, and has a light-emitting end surface and a light-reflecting end surface is included, in which the light-emitting end surface has at least a light-emitting end surface second region which is configured to have an end surface of the second compound semiconductor layer and a light-emitting end surface third region which is configured to have an end surface of the third compound semiconductor layer, and an angle between a virtual vertical surface in the light-emitting end surface and the light-emitting end surface second region is set to $theta_2$, and an angle between the virtual vertical surface in the light-emitting end surface and the light-emitting end surface third region is set to $theta_3$, and "absolute value of $theta_3$ is equal to or greater than 0 degree and smaller than absolute value of $theta_2$," is satisfied.

[02] The light-emitting element according to [01], in which "absolute value of $theta_3$ is equal to or smaller than 2.0 degrees" is satisfied.

[03] The light-emitting element according to [01] or [02], in which "absolute value of ($theta_2$ – $theta_3$) is grater than 2.0 degree" is satisfied.

[04] The light-emitting element according to any one of [01] to [03], in which the laminated structure is made of an AlGaInN-based compound semiconductor.

[05] The light-emitting element according to [04], in which the second compound semiconductor layer has a negative value of an amount of lattice distortion with respect to GaN, and is made of a mixed crystal in which an absolute value of the amount of lattice distortion is 0.02% or more.

[06] The light-emitting element according to [05], in which an active layer includes an $In_XGa_{(1-X)}N$ layer, and the second compound semiconductor layer includes at least an $Al_XIn_YGa_{(1-X-Y)}N$ layer (where, X>0, Y is equal to or greater than 0).

[07] The light-emitting element according to any one of [01] to [06], in which the light-emitting end surface includes a light-emitting end surface first region which is configured to have an end surface of the first compound semiconductor layer, and when an angle between the virtual vertical surface in the light-emitting end surface and the light-emitting end surface first region is set to $theta_1$, "absolute value of $theta_3$ is equal to or greater 0 degree and equal to or smaller than absolute value of $theta_1$" is satisfied.

[08] The light-emitting element according to any one of [01] to [07], in which the first compound semiconductor layer includes an $Al_{X'}In_{Y'}Ga_{(1-X'-Y')}N$ layer (where, X' is equal to or greater than 0, Y' is equal to or greater than 0).

[09] The light-emitting element according to any one of [01] to [08], in which the laminated structure is formed on a semi-polar or non-polar main surface of a GaN substrate.

[10] The light-emitting element according to [09], in which the laminated structure is made by laminating the first compound semiconductor layer, the third compound semiconductor layer, and the second compound semiconductor layer on the GaN substrate in this order.

[11] The light-emitting element according to any one of [01] to [10], in which, when an axial direction of a laminated structure towards a light-reflecting end surface from a light-emitting end surface is set to an X direction, and a thickness direction of the laminated structure is set to a Z direction, a cross-sectional shape of the light-emitting end surface when cutting the laminated structure in an XZ virtual plane has a complementary shape to a cross-sectional shape of the light-reflecting end surface.

[12] The light-emitting element according to any one of [01] to [11], in which the first compound semiconductor layer is made of at least a first cladding layer, the third compound semiconductor layer is made by laminating a first light guide layer, an active layer, and a second light guide layer from the first compound semiconductor layer side, and the second compound semiconductor layer is made of at least a second cladding layer.

The present disclosure can also be configured as follows.

[01] <<light-emitting element>>
A light-emitting element comprising:
a laminated structure including
   a first compound semiconductor layer having a first conductivity type,
   a second compound semiconductor layer having a second conductivity type different than the first conductivity type, and
   a third compound semiconductor layer formed between the first and second compound semiconductor layers and including an active layer,
wherein a second end surface of the second compound semiconductor layer and a third end surface of the third compound semiconductor layer are formed at respective second and third angles theta2 and theta3 relative to a virtual vertical direction of the laminated structure and satisfy the following relationship: "absolute value of $\text{theta}_3$ is equal to or greater than 0 degree and smaller than absolute value of $\text{theta}_2$".

[2] The light-emitting element according to [1], wherein |theta2−theta3| is greater than 2.0 degrees.

[3] The light-emitting element according to [1], wherein |theta2−theta3| is greater than 3.0 degrees.

[4] The light-emitting element according to [1], wherein a first end surface of the first compound semiconductor is formed at a first angle theta1 relative to the virtual vertical direction of the laminated structure and satisfies the following relationship: "absolute value of $\text{theta}_3$ is equal to or greater than 0 degree and smaller than absolute value of $\text{theta}_1$".

[5] The light-emitting element according to [4], wherein |theta1−theta3| is greater than 1.0 degrees.

[6] The light-emitting element according to [1], wherein |theta3| is less than or equal to 2.0 degrees.

[7] The light-emitting element according to [1], wherein |theta3| is about 0 degrees.

[8] The light-emitting element according to [1], wherein a third end surface of the third compound semiconductor layer includes a step structure.

[9] The light-emitting element according to [1],
wherein the first compound semiconductor layer has an opposed first end surface positioned opposite to the first end surface, the second compound semiconductor layer has an opposed second end surface positioned opposite to the second end surface, and the third compound semiconductor layer has a third end surface and an opposed third end surface positioned opposite to the third end surface, and
wherein the first, second and third end surfaces are light-emitting end surfaces, and the opposed first, second and third end surfaces are light-reflecting surfaces.

[10] The light-emitting element according to [9], wherein the opposed first, second and third end surfaces have at least substantially the same first, second and third angles relative to the virtual vertical direction, respectively, as the first, second and third end surfaces, such that cross-sectional shapes of the light-emitting end surface and the light-reflecting end surface of the laminated structure are at least substantially complementary.

[11] The light-emitting element according to [1], further comprising a substrate that has a semi-polar or non-polar main surface, the laminated structure being formed on the substrate.

[12] The light-emitting element according to [11], wherein the substrate surface is selected from the group consisting of a {20-21} surface, a {1-102} r surface, a {1-101} surface, a {11-22} surface, a {2-201} surface, and a {0001} surface.

[13] The light-emitting element according to [1], wherein the light-emitting element is a semiconductor laser element of an index-guided type, and includes a ridge stripe structure.

[14] The light-emitting element according to [1], wherein the laminated structure is an AlGaInN-based compound semiconductor.

[15] The light-emitting element according to [14], further comprising a GaN based substrate, and the second compound semiconductor layer has a negative value amount of lattice distortion with respect to the GaN substrate.

[16] The light-emitting element according to [14], further comprising a GaN based substrate, and the first compound semiconductor layer has at least substantially zero lattice distortion with respect to the GaN substrate.

[17] A light-emitting element comprising:
a laminated structure including
   a first compound semiconductor layer having a first conductivity type,
   a second compound semiconductor layer having a second conductivity type different than the first conductivity type, and
   a third compound semiconductor layer formed between the first and second compound semiconductor layers and including an active layer,
wherein a first end surface of the first compound semiconductor layer, a second end surface of the second compound semiconductor layer, and a third end surface of the third compound semiconductor layer are formed at respective first, second and third angles theta1, theta2 and theta3 relative to a virtual vertical direction of the laminated structure and satisfy the following relationships: |theta2−theta3| is greater than 2.0 degrees; and |theta1−theta3| is greater than 1.0 degrees.

[18] The light-emitting element according to [17], wherein |theta3| is less than or equal to 2.0 degrees.

[19] The light-emitting element according to [17], wherein |theta3| is about 0 degrees.

[20] The light-emitting element according to [17], wherein the third end surface of the third compound semiconductor layer includes a step structure.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 10 light-emitting element (semiconductor laser element)
11 GaN substrate
12 ridge stripe structure
20 laminated structure
30 first compound semiconductor layer
31 first cladding layer
40 second compound semiconductor layer
41 second cladding layer
42 contact layer 43 laminated insulating film
50 third compound semiconductor layer
51 first optical guide layer
52 active layer
53 second light guide layer
60 light-emitting end surface
61 light-emitting end surface first region
62 light-emitting end surface second region
63 light-emitting end surface third region
70 light-reflecting end surface
71 light-reflecting end surface first region
72 light-reflecting end surface second region
73 light-reflecting end surface third region
81 first electrode
82 second electrode

The invention claimed is:

1. A light-emitting element, comprising:
a laminated structure including a first compound semiconductor layer having a first conductivity type, a second compound semiconductor layer having a second conductivity type different than the first conductivity type, and a third compound semiconductor layer that includes an active layer,
wherein the third compound semiconductor layer is between the first compound semiconductor layer and the second compound semiconductor layer,
wherein a second end surface of the second compound semiconductor layer makes a second angle (theta2) relative to a direction along a thickness of the laminated structure,
wherein an opposed second end surface, of the second compound semiconductor layer, is opposite to the second end surface,
wherein a third end surface of the third compound semiconductor layer makes a third angle (theta3) relative to the direction along the thickness of the laminated structure,
wherein the second end surface is a light-emitting surface and the opposed second end surface is a light-reflecting surface,
wherein an absolute value of an amount of lattice distortion in the second compound semiconductor layer is greater than 0.02%, and
wherein, based on the absolute value of the amount of lattice distortion, the theta2 and the theta3 satisfy a first relationship: "absolute value of the theta3 is equal to or greater than 0 degree and smaller than absolute value of the theta2".

2. The light-emitting element according to claim 1, wherein |theta2−theta3| is greater than 2.0 degrees.

3. The light-emitting element according to claim 1, wherein |theta2−theta3| is greater than 3.0 degrees.

4. The light-emitting element according to claim 1, wherein a first end surface of the first compound semiconductor layer makes a first angle (theta1) relative to the direction along the thickness of the laminated structure and satisfies a second relationship: "absolute value of the theta3 is equal to or greater than 0 degree and smaller than absolute value of the theta1".

5. The light-emitting element according to claim 4, wherein |theta1−theta2| is greater than 1.0 degrees.

6. The light-emitting element according to claim 1, wherein |theta2| is less than or equal to 2.0 degrees.

7. The light-emitting element according to claim 1, wherein |theta3| is equal to 0 degrees.

8. The light-emitting element according to claim 1, wherein the third end surface of the third compound semiconductor layer includes a step structure.

9. The light-emitting element according to claim 1,
wherein the third compound semiconductor layer has an opposed third end surface opposite to the third end surface, and the first compound semiconductor layer has a first end surface and an opposed first end surface opposite to the first end surface, and
wherein the third end surface and the first end surface are light-emitting surfaces, and the opposed third end surface and opposed first end surface are light-reflecting surfaces.

10. The light-emitting element according to claim 9,
wherein the opposed first end surface, the opposed second end surface, and the opposed third end surface make a first angle, the second angle, and the third angle relative to the direction along the thickness of the laminated structure, respectively, and
wherein a first cross-sectional shape of each of the opposed first end surface, the opposed second end surface, and the opposed third end surface is same as that of a second cross-sectional shape of each of the first end surface, the second end surface, and the third end surface, respectively.

11. The light-emitting element according to claim 1, further comprising a substrate that has at least one of a semi-polar main surface or a non-polar main surface,
wherein the laminated structure is on the substrate.

12. The light-emitting element according to claim 11, wherein a surface of the substrate is at least one of a {20-21} surface, a {1-102} r surface, a {1-101} surface, a {11-22} surface, a {2-201} surface, or a {0001} surface.

13. The light-emitting element according to claim 1,
wherein the light-emitting element is a semiconductor laser element of an index-guided type, and
wherein the semiconductor laser element includes a ridge stripe structure.

14. The light-emitting element according to claim 1, wherein the laminated structure is an AlGaInN-based compound semiconductor.

15. The light-emitting element according to claim 14, further comprising a GaN based substrate, wherein the second compound semiconductor layer has a negative value amount of lattice distortion with respect to the GaN based substrate.

16. The light-emitting element according to claim 14, further comprising a GaN based substrate, wherein the first compound semiconductor layer has zero lattice distortion with respect to the GaN based substrate.

17. A light-emitting element, comprising:
a laminated structure including a first compound semiconductor layer having a first conductivity type, a second compound semiconductor layer having a second conductivity type different than the first conductivity type, and a third compound semiconductor layer that includes an active layer,
wherein the third compound semiconductor layer is between the first compound semiconductor layer and the second compound semiconductor layer,
wherein a first end surface of the first compound semiconductor layer makes a first angle (theta1) relative to a direction along a thickness of the laminated structure, wherein a second end surface of the second compound semiconductor layer makes a second angle (theta2) relative to the direction along the thickness of the laminated structure, wherein an opposed second end surface, of the second compound semiconductor layer, is opposite to the second end surface, wherein a third end surface of the third compound semiconductor layer makes a third angle (theta3) relative to the direction along the thickness of the laminated structure, wherein the second end surface is a light-emitting surface and the opposed second end surface is a light-reflecting surface, wherein an absolute value of an amount of lattice distortion in the second compound semiconductor layer is greater than 0.02%, and wherein, based on the absolute value of the amount of lattice distortion, the theta1, the theta2, and the theta3 satisfy following relationships: |theta2−theta3| is greater than 2.0 degrees, and |theta1−theta3| is greater than 1.0 degrees.

18. The light-emitting element according to claim 17, wherein |theta3| is less than or equal to 2.0 degrees.

19. The light-emitting element according to claim 17, wherein |theta3| is less than or equal to 0 degrees.

20. The light-emitting element according to claim 17, wherein the third end surface of the third compound semiconductor layer includes a step structure.

\* \* \* \* \*